United States Patent
Takahashi et al.

[11] Patent Number: 5,292,458
[45] Date of Patent: Mar. 8, 1994

[54] METHOD OF PRODUCING PHOTOSENSITIVE MICROCAPSULES

[75] Inventors: Hiroshi Takahashi; Toshihiko Sakuhara; Fumiharu Iwasaki, all of Tokyo, Japan

[73] Assignee: Seiko Instruments Inc., Japan

[21] Appl. No.: 682,914

[22] Filed: Apr. 9, 1991

[30] Foreign Application Priority Data

| Apr. 10, 1990 | [JP] | Japan | 2-94305 |
| Jun. 5, 1990 | [JP] | Japan | 2-147021 |
| Jun. 15, 1990 | [JP] | Japan | 2-158191 |
| Jul. 5, 1990 | [JP] | Japan | 2-179250 |
| Oct. 17, 1990 | [JP] | Japan | 2-278194 |

[51] Int. Cl.$^5$ .................. B01J 13/16; G03C 1/72
[52] U.S. Cl. .................. 264/4.7; 252/194; 252/600; 264/4.6; 430/138; 503/215; 522/902
[58] Field of Search .................. 252/194, 600, 174.13; 264/4.6, 4.7; 430/138; 522/902, 57, 65; 503/215

[56] References Cited

U.S. PATENT DOCUMENTS

| 2,730,456 | 1/1956 | Green et al. | 503/214 |
| 3,427,250 | 2/1969 | Haas et al. | 264/4.7 |
| 3,577,515 | 5/1971 | Vandegaer | 264/4.7 X |
| 3,730,905 | 5/1973 | Koerner et al. | 264/4.7 |
| 3,796,669 | 3/1974 | Kiritani et al. | 264/4.7 |
| 4,228,216 | 10/1980 | Austin et al. | 264/4.7 X |
| 4,482,624 | 11/1984 | Arnev et al. | 430/138 |
| 4,532,183 | 7/1985 | Shackle et al. | 264/4.7 X |
| 4,565,764 | 1/1986 | Nakahara et al. | 430/138 X |
| 4,755,445 | 7/1988 | Hasegawa | 430/138 |
| 4,755,446 | 7/1988 | Keys et al. | 430/138 |
| 4,885,350 | 12/1989 | Yamashita et al. | 526/909 X |
| 4,912,011 | 3/1990 | Yamamoto et al. | 430/138 |
| 4,973,541 | 11/1990 | Kohri et al. | 430/138 X |
| 5,068,067 | 11/1991 | Kawai et al. | 430/138 X |

*Primary Examiner*—Richard D. Lovering
*Attorney, Agent, or Firm*—Bruce I. Adams; Van C. Wilks

[57] ABSTRACT

A method of producing a photosensitive microcapsule which contains a polymerizable monomer and a polymerization initiator. Soluble water is displaced in the polymerizable monomer by performing one or both of distilling the polymerizable monomer and adding a dehydrating agent to the polymerizable monomer. The polymerization initiator and a first microcapsule-forming material are added to the water-displaced polymerizable monomer to produce a solution. Soluble oxygen in the polymerizable monomer is displaced by performing one or both of bubbling an inert gas and adding an oxygen absorbent to the polymerizable monomer. Soluble oxygen may also be displaced in an ionic surfactant by performing the bubbling and adding of oxygen absorbent. The ionic absorbent is added to the solution containing the polymerizable monomer and polymerization initiator, and then the solution is emulsified. A microcapsule membrane is produced by adding a second microcapsule-forming material to the emulsion.

22 Claims, 2 Drawing Sheets

METHOD OF PRODUCING PHOTOSENSITIVE MICROCAPSULES

BACKGROUND OF THE INVENTION

The present invention relates to a photoimaging and thermal development recording media utilizing microcapsules.

Examples of a photoimaging recording media utilizing microcapsules include U.S. Pat. Nos. 4,529,681 (Usami et al.), 4,916,042 (Sakojiri et al.), 4,440,846 (Sanders et al.), 4,339,209 (Sanders et al.), and U.S. patent application Ser. No. 407,406 (Sakojiri et al.) filed on Sep. 14, 1989.

Those recording media utilize photoimaging forming materials such as a polymerizable monomer, photopolymerization initiator, and/or dye precursor etc. contained in the microcapsules as the main compounds. When a recording sheet (such as a plastic film) is coated with the microcapsules and image-wise exposed with light, the exposed portion of the microcapsules harden. Pressure or heat is applied to the unexposed portion of the microcapsules to emit the compounds contained in the microcapsules to form an image.

However, the conventional photopolymerization initiator is mainly a water soluble pigment and suffers from serious drawbacks. The water soluble pigment is easily diffused into a water phase which causes difficult emulsification while the microcapsules are produced. Consequently, the obtained microcapsules are not evenly photosensitized. At the worst, some conventionally produced microcapsules remain unhardened even if exposed.

In particular, monomer polymerization requiring light energy does not produce a sufficiently strong polymer because the photopolymerization initiator is inactivated by water. The grown-polymer-radical and water react with each other, and the polymerization reaction is stopped and a polymer of a low molecular weight is produced. If this sort of polymerizable monomer is contained in the microcapsules, the contained water in the polymerizable monomer increases during the process of microencapsulation. This contained water impedes the photopolymerization reaction, and the exposure of the light energy does not enable a sufficient hardening of the microcapsules thus lowering the microcapsule photosensitivity.

Further, a nonionic surfactant such as polyvinyl alcohol (PVA), polyethyleneglycol (PEG), and solitan derivative are conventionally used as the surfactant for producing the microcapsules.

The microcapsules including the polymerizable monomer are compounded with the nonionic surfactant, however, polymerization reaction, such as radial polymerization, is impeded by the invasion of water in the microcapsules through the process of microcapsulation. Accordingly, the conventional microcapsule polymerization process still results in low-weight molecules, or the polymerization process does not produce any reaction at all, and thus the internal part of the microcapsules does not harden completely.

If the polymerizable monomer which is the content of the microcapsules includes abundant oxygen, various problems result such as a sufficiently strong polymer cannot be produced because the polymerization initiator is inactivated by the oxygen, the grown-polymer-radical reacts with the oxygen, and a low polymer is produced.

SUMMARY OF THE INVENTION

It is an object of the present invention to provide a highly photosensitive microcapsule recording media.

It is another object of the present invention to provide an improved method of forming highly photosensitive microcapsules.

In accordance with the present invention, a hydrophobic sensitizer and a polymerization initiating species producer are utilized to produce a polymerization initiating species which reacts with a chemically changed sensitizer due to the exposure of the photopolymerization initiator contained in the microcapsules.

For example, a sensitizer having at least one kind of the long-chain alkyl group within the scope of carbon number 8 to 20 in the molecules is used as the hydrophobic sensitizer. Microcapsules produced in accordance with the present invention have a photopolymerization initiator that does not dissolute to the water phase in the process of the emulsion forming. The microcapsules obtained as a result are highly sensitive and exhibit even sensitivity to light.

Further, the inventive method distills the polymerizable monomer and/or adds the dehydrating agent to the polymerizable monomer so as to remove the soluble water in the polymerizable monomer.

Moreover, an ionic surfactant is used to prevent water invasion in the microcapsules and to provide a stable emulsion while the microcapsules are produced.

The inventive method removes soluble oxygen in the polymerizable monomer by substituting the soluble oxygen with an inert gas such as nitrogen, argon, etc. by means of bubbling and/or adds an oxygen absorbent to the polymerizable monomer.

By means of the above method, the polymerizable monomer is hardened by the light exposure, and highly photosensitive microcapsules can be obtained.

Particularly, color image recording can be easily materialized by the use of the sensitizing sheet coated with three kinds of the microcapsules containing three kinds of the photopolymerization initiators reacting to the visible lights of wave length, 380–520 nm, 460–620 nm, or 580–780 nm.

DETAILED DESCRIPTION OF THE PREFERRED EMBODIMENT

Figure 1:
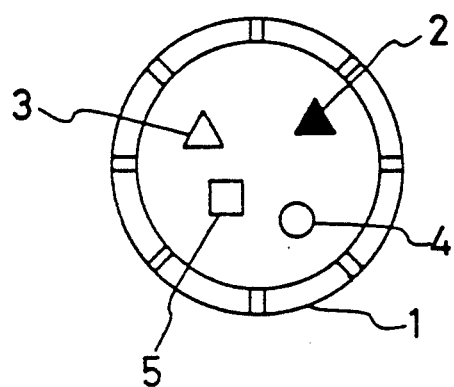
FIG. 1 illustrates a schematic diagram of a porous membrane microcapsule.

The embodiment of the present invention is described based on the diagram as follows:

FIG. 1 illustrates the schematic diagram of the porous membrane microcapsules of the present invention. The porous membrane microcapsules having a porous membrane with many small pores enable the emission of the content of the porous membrane microcapsules under thermal excitation. A sensitizer 3 in the porous membrane microcapsules 1 absorbs light of the photosensitive wavelength, reacts with the polymerization initiating species produces 4, produces the polymerization initiating species to polymerize the polymerizable monomer 5, and hardens the polymerizable monomer 5. This polymerization also enables the control of the quantity of emission of the content in the porous membrane microcapsules by heat because the degree of polymerization can be controlled by the energy amount of the light of the photosensitive wavelength.

Figure 2:
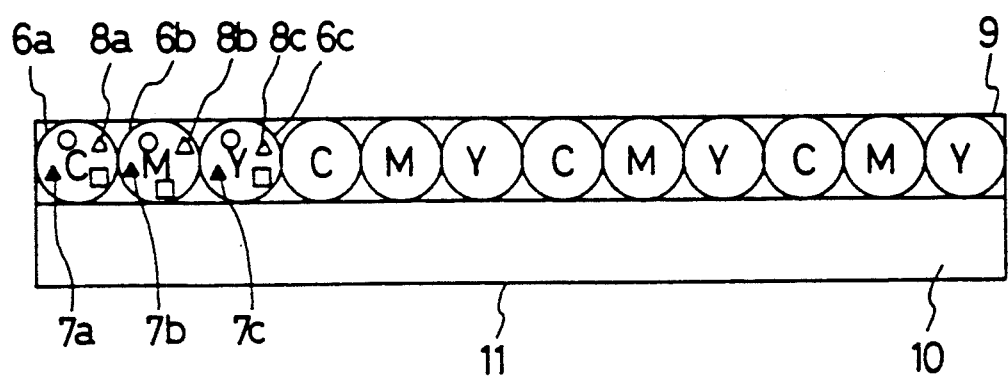
FIG. 2 illustrates a schematic diagram of a photoimaging and thermal development recording media by the use of the porous membrane microcapsules.

FIG. 2 illustrates the schematic diagram of a photoimaging and thermal development recording media in accordance with the present invention. A substrate 10 is comprised of about a 10μm thermal resistance resin film such as polyethylene terephthalate (PET). The porous membrane microcapsules layer including porous membrane microcapsules 6a, 6b, and 6c contained each different dye precursor and the sensitizer photosensitive to the visible light with the different wavelength is disposed on the substrate.

Figure 3A:
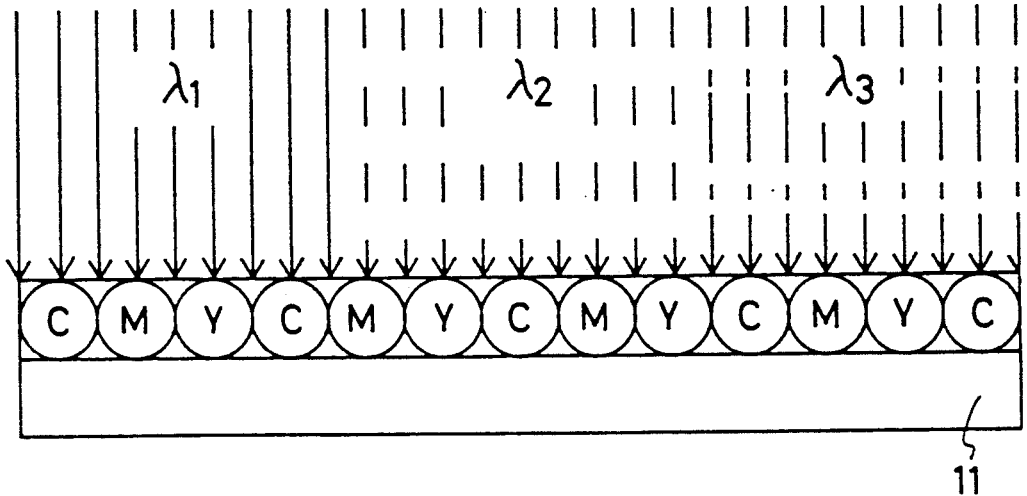
FIG. 3(a) illustrates a schematic diagram of a color thermal transfer recording by the use of photoimaging recording media in FIG. 2.
Figure 3B:
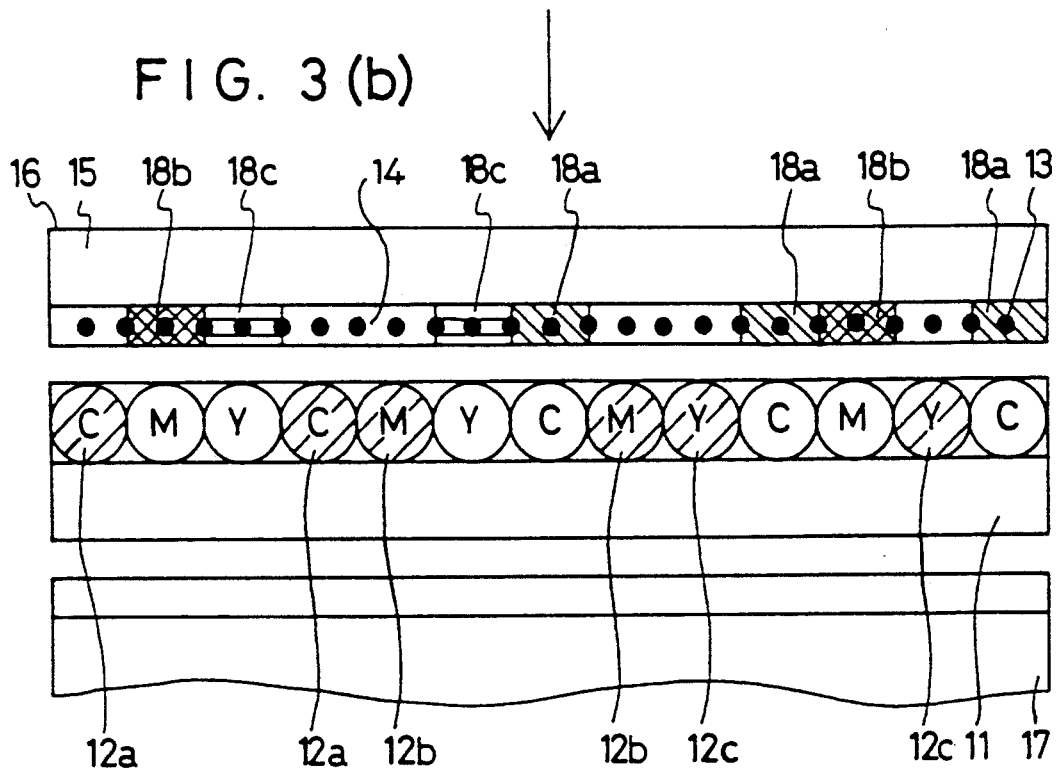
FIG. 3(b) illustrates a schematic diagram of a color thermal transfer recording by the use of the thermal development recording media in FIG. 2.

FIGS. 3(a) and (b) illustrate the schematic diagram of the color thermal transfer recording by the use of the photoimaging and thermal development recording media in FIG. 2. The porous membrane microcapsules 6a, 6b, and 6c in the porous membrane microcapsule layer become hardened according to each wavelength, $\lambda_1$, $\lambda_2$, and $\lambda_3$ ($\lambda_1$: 580–780 nm, $\lambda_2$: 460–620 nm, $\lambda_3$: 380–520 nm) according to an image outputted from a CRT.

Thus, the porous membrane microcapsules layer 9 of the photoimaging and thermal development recording media 11 forming a latent image with the visible light is superposed on the developer layer 14 on the receiver sheet 16 which reacts with the dye precursors 7a, 7b, and 7c to develop the color image facing each other. The dye precursor of each color in the unhardened porous membrane microcapsules 6a, 6b, and 6c of each color is released by the thermal application with a thermal head 17, a heat roller, and a rubber heater, etc. from the other side of the porous membrane microcapsules layer 9 of the photoimaging and thermal development recording media 11. The dye precursor of each color passes through the pores in the capsule of the porous membrane microcapsules, reacts to develop the color on the developer 13 on the receiver sheet, obtains the color developing portion of each color according to the image, and then enables to the transfer the colored image.

(1) Hydrophobic Sensitizer

The inventive method to synthesize the sensitizer having the long-chain alkyl group as an embodiment of the hydrophobic sensitizer in the present invention is described as follows:

(1.1) The Synthesis of the Sensitizer Precursor (N, N-Octadecylmethyl-P-phenylendiamine)

Dissolve 28.2 g (0.2 mol) p-fluoronitrobenzene into 300 ml tetrahydrofuran. Add a solution of which 56.4 g (0.2 mol) N, N-octadecylmethylamine and 20.3 g (0.2 mol) triethylamine are dissolved in 300 ml tetrahydrofuran into the above solution, while stirring. After the completion of the adding heat and reflux it for four days. 60.6 g (0.15 mol) N, N-octadecylmethyl-p-nitroaniline is obtained by recrystalization of the solution using ethyl alcohol and water after concentrating the above solution.

100 ml 2N hydrochloric acid is added to a solution of which 60.6 g (0.15 mol) N, N-octadecylmethyl-p-nitroaniline is dissolved into 500 ml ethyl alcohol. 52.5 g (0.13 mol) N, N-octadecylmethyl-p-phenylenediamine is obtained after adding 48.8 g (0.75 mol) zinc dust to the solution and heat and reflux it for one hour.

(1.2) The Synthesis of the Sensitizer Precursor (N, N-Octadecylmethyl-o-phenylenediamine)

Add 23.6 g (0.22 mol) N-methylaniline into 92 g (0.2 mol) 14% hexane solution of N-butyllithium and stir it for 10–20 minutes. Drop 33.3 g (0.1 mol) octadecylbromide into the above solution, while stirring it. Add 200 ml water into the solution, after heating and refluxing the solution for about 17 hours and cooling it down to room temperature. Add 6N hydrochloric acid to the solution after concentrating the solution extracted by 300 ml diethyl ether and deposit it. 32.3 g (0.09 mol) N, N-methyloctadecylaniline is obtained by refinement through crystalization with ethyl alcohol and water. Dissolve the obtained 32.3 g (0.09 mol) N, N-methyloctadecylaniline into 250 ml concentrated sulfuric acid. Add 30 ml concentrated nitric acid into the solution while stirring it in an ice water bath. Leave it about one hour after adding the nitric acid. Add the solution into ice water filter off the deposit from it, and refine it by crystalization with ethyl alcohol and water. With the above step, 14.5 g (0.036 mol) N, N-octadecylmethyl-o-nitroaniline is obtained. Add 100 ml 2N hydrochloric acid into this 14.5 g (0.036 mol) N, N-octadecylmethyl-o-nitroaniline which is dissolved into 200 ml ethyl alcohol. 11.7 g (0.031 mol) N, N-octadecylmethyl-o-phenylene-diamine is obtained after adding 11.75 (0.18 mol) zinc dust into the above solution to be heated and refluxed for one hour.

(1.3) The Synthesis of Blue Color Sensitizer [3,7-bis (octadecylmethylamino) phenothiazoniumchloride]

Add 50 ml 3N hydrochloric acid into 10 g (27 mmol) N, N-octadecylmethyl-p-phenylenediamine obtained by (1.1) which is dissolved into 100 ml ethyl alcohol. Add a solution of which 8.1 g (27 mmol) sodium bichromate is dissolved to 10 ml water into the above solution which hydrogen sulfide gas is bubbled in a stirring condition. Stir it for about 6 hours. Filter off the deposit adding the solution into one liter ice water. 2 g (2.63 mmol) 3,7-bis (octadecylmethylamino) phenothiazoniumchloride is obtained after refining the deposit with butyl alcohol using a column chromatography.

(1.4) The Synthesis of Red Color Sensitizer [3,7-di (octadecylmethylamino)-5-phenylphenazoniumchloride]

Add 50 mg 3N hydrochloric acid to 10g (27 mmol) N, N-octadecylmethyl-p-phenylenediamine obtained by (1.1) which is dissolved into 100 ml ethyl alcohol. Add 4 g (13.4 mmol) sodium bichromate into the above solution while stirring. Later, add 1.25 g (13.5 mmol) aniline, and further add 4 g (13.4 mmol) sodium bichromate to the solution while stirring. Filter off the deposit after adding the solution to 1 liter ice water. 2.2 g (2.7 mmol) 3,7-di (octadecylmethylamino)-5-phenylphenazoniumchloride is obtained after refining the deposit with butyl alcohol using the column chromatography.

(1.5) The Synthesis of Yellow Color [3,6-di (octadecylmethylamino)-acridinechloride]

Dissolve 10 g (27 mmol) N, N-octadecylmethyl-o-phenylenediamine obtained by (1.2) into 100 ml ethyl alcohol. Add 1.32 g (13.5 mmol) concentrated sulfuric acid which is added to 1.24 g (13.5 mmol) formic acid and 2.48 g (13.5 mmol) glycerol to the above solution. Heat and stir this solution for about 5 hours. Add 50 ml 2N hydrochloric acid to the solution and heat, stir, and concentrate it. 2.2 g (2.8 mmol) 3, 6-di (octadecylmethylamino) acridinechloride is obtained by refining the solution with butyl alcohol using column chromatography.

(1.6) Other Hydrophobic Sensitizer

An embodiment of the hydrophobic sensitizer of carbon number 8-20, long-chain alkyl group is described in (1.3)–(1.5). As the hydrophobic sensitizer in the present invention, the substance is formed by an ion complex of the sensitizing dye and the substance expressed by the following chemical structure.

(a)

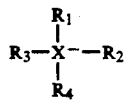

Where:
X=B or P; and
at least 3 in $R_1$ to $R_4$ are hydrocarbon which has carbon number 2-6.

(b) $H_2PO_4^-$
(c) $H_2BO_4^-$
(d) $ClO_4^-$ (2) Porous Membrane Microcapsules

The production method of three color porous membrane microcapsules containing three kinds of the hydrophobic sensitizer having different photosensitive wavelength synthesized by the above (1.3), (1.4) and (1.5) is described as follows:

(2.1) Blue Color porous Membrane Microcapsules

Disperse 1.4 g cyan color dye precursor into 25 g trimethylolpropanetriacrylate using a ballmill for 24 hours. Separate this solution, add 5 g hexamethylene diisocyanate as the material of the porous membrane microcapsule monomer A and the solution of 0.03 g 3, 7-bis (octadecylmethylamino) phenothiazoniumchloride as the blue sensitizer synthesized by (1.3), and 0.1 g N-phenylglycine as the polymerization initiating species producer in 1 g N, N-dimethylformamide to a dispersant of cyan color dye precursor, to make a solution to be contained in the porous membrane microcapsules. Add the solution to be contained in the porous membrane microcapsules to 3% (W/W) polyvinyl alcohol aqueous solution as a surfactant solution, and which is emulsified and dispersed with a homogenizer. Blue color porous membrane microcapsules are obtained by stirring for one hour after adding 2.93 diethylenetriamine as the porous membrane microcapsule membrane monomer B to the emulsified dispersant while stirring it with a stirrer, forming the porous membrane of a microcapsule, and filtering the solution.

(2.2) Red Color Porous Membrane Microcapsules

The production method is the same as (2.1) except the steps of using a magenta color dye precursor and 3, 7-di (octadecylmethylamino)-5-phenylphenazoniumchloride composed by (1.4) as the red sensitizer.

(2.3) Yellow Color Porous Membrane Microcapsules

The production method is the same as (2.1) except the steps of using yellow color dye precursor and 3,6-di (octadecylmethylamino)-acridinechloride synthetized by (1.5) as the yellow sensitizer.

(3) Photoimaging and Thermal Development Recording Media

Disperse 5 g of each color dye precursor of the porous membrane microcapsules obtained by (2.1), (2.2), and (2.3) to 20g 5% (W/W) polyvinylalcohol solution. Photoimaging and thermal development recording media is produced by coating the solution on 8μm polyethyleneterephthalate (PET) film as a substrate with a barcoater.

(4) Receiver Sheet

Disperse 15 g developer reacting to each color dye precursor to develop colors to 20 g 3% (W/W) polyvinylalcohol aqueous solution with the ballmill for 24 hours. The receiver sheet is produced by coating 20 g/m² (dry weight) above dispersed solution on a sheet of paper (40 g/m²) of fine quality with the barcoder.

(5) Embodiment of the Color Image Recording

The color image is obtained with the photoimaging and thermal development recording media and the receiver sheet obtained by (3) and (4) as follows:

A latent image is formed at one minute irradiation of the light from 300W xenon short arc lamp through the optical filters according to the color image; 650 nm light to the blue color porous membrane microcapsules, 550 nm light to the red color porous membrane microcapsules, and 450 nm light to the yellow color porous membrane microcapsules to the photoimaging and thermal development recording media.

The porous membrane microcapsule layer of the photoimaging and thermal development recording media forming the latent image is superposed on the developer layer of the receiver sheet facing each other. The color image is developed by transferring the content of the porous membrane microcapsules with the thermal head print recording apparatus from the other side of the porous microcapsule layer of the photoimaging and thermal development recording media.

Thus, the photoimaging and thermal development recording media enables separate colors by the photosensitive wave length and controls a continual gradient with the light irradiation intensity. A color image of fine quality is obtained with the simple method.

(6) Ionic Surfactant

The ionic surfactant which is effective to prevent the sensitizer from becoming soluble to the water phase when the microcapsules are produced is as follows:

(6.1) Embodiments of the Ionic Surfactant

The ionic surfactant which has the molecular structure which can be used in the present invention is as follows;

(a) R—COONa
(b) R—OSO₃Na
(c) $R_1$—SO₃Na
(d) $R_1$ —(OSONa)— COO—$R_2$
(e) $R_1$—CONH—$R_2$—CH₂CH₂OSO₃Na
(f) R—OP —(ONa )2
(g)

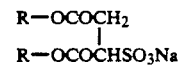

(h) $R_1$—CON—$R_2$CH₂CH₂SO₃Na (i) 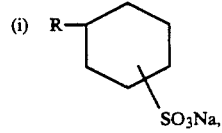

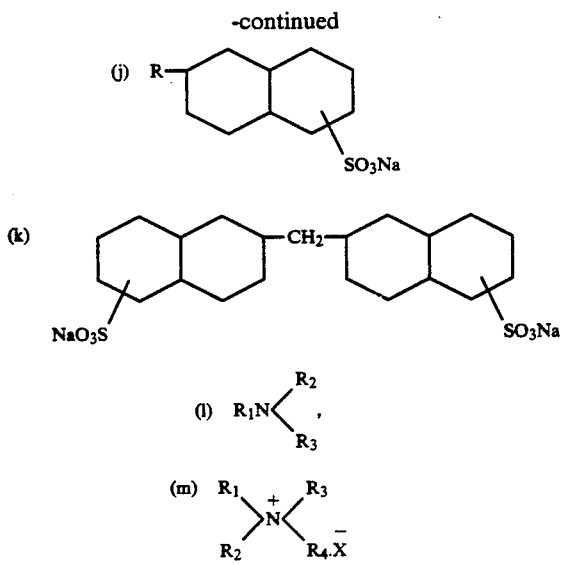

Where:
Rn = Alkyl group
X = Halogen (6.2) Production of the Microcapsules With the Ionic Surfactant A hardening experiment with light irradiation carried out for each color porous membrane microcapsules obtained by using 3% (W/W) styrene maleic anhydride copolymer aqueous solution as the surfactant solution instead of 3% (W/W) polyvinyl alcohol aqueous solution in the production process of the porous membrane microcapsules of (2.1), (2.2), and (2.3). Thus, microcapsules of very short hardening period (2 to 3 seconds) is obtained in comparison with that of the prior art.

(6.3) The Concentration of the Ionic Surfactant

The concentration of the ionic surfactant used in (6.2) has the optimal range. That is, if the surfactant in the water phase is highly concentrated, all the water phase becomes highly viscous. The microcapsules cannot be separated from the dispersant with filtration or centrifugation after the microcapsules are produced. If the concentration of surfactant is too low, an emulsion protective function becomes low, and the plurality of the emulsion particles fuse and stick together in the process of the microcapsule membrane formation. Accordingly, the microcapsules of fine quality cannot be obtained.

Thus, the various experiments prove that the use of the concentration range, 1 to 10% (W/W) ionic surfactant aqueous solution brings up the optimal consequences for the water phase to produce O/W type (oil-water surface type) emulsion in the production process of the porous membrane microcapsules.

(7) The Influence of Water

The comparison is made between the present invention and the prior art in the production method of microcapsules. The measures are taken to meet the situation which photosensitivity becomes low due the soluble water contained in the microcapsules as follows:

(7.1) The Distillation of the Polymerizable Monomer

Trimethylolpropanetriacrylate (TMPTA) as the polymerizable monomer is refined by vacuum distillation. (Boiling point 163°–167° C./2 mmHg)

The porous membrane microcapsules are produced by the use of this distilled TMPTA in the same method of (2.1), (2.2), and (2.3).

(7.2) The Dehydrating Agent Addition

The porous membrane microcapsules are produced by the above same method after adding 4 g sodium sulfate anhydrous as the dehydrating agent to the solution to be contained in the microcapsules produced by the same method of (2.1), (2.2), and (2.3).

(7.3) The Use of Distillation Combined with Dehydrating Agent

The porous membrane microcapsules are produced by (7.1) distillation process combined with (7.2) dehydration process.

(7.4) The Comparison of Photosensitivity

Table 1 demonstrates the period for hardening which relates to photosensitivity in the methods of (7.1), (7.2), and (7.3) and of the prior art which has no dehydration process in the production of microcapsules.

The periods for hardening are figured out from a starting period of irradiating the light energy of $3.3 \times 10^6$ erg/sec cm$^2$ through a ultraviolet rays cut filter to the porous membrane microcapsules obtained by each method, to a period of which hardening is done.

TABLE 1

| | Period for Hardening |
|---|---|
| The Prior Art | 2.55 (sec) |
| Distillation (7.1) | 1.39 |
| Dehydration (7.2) | 1.77 |
| Distillation & Dehydration (7.3) | 1.09 |

Thus, the distillation for the polymerizable monomer (7.1) and the dehydrating agent addition (7.2) obtained results in considerably shorter times in hardening of microcapsules. Moreover, the combination of both methods proves a noticeable effect in comparison with the method of the prior art.

(8) The Influence of Oxygen

The comparison is made between the present invention and the prior art in the production method of microcapsules. The measures are taken to meet the situation which photosensitivity becomes low by the soluble oxygen contained in a microcapsules as follows:

(8.1) The Polymerizable Monomer to be Bubbled by the Inert Gas

Bubble the solution to be contained in the microcapsules with a nitrogen gas for about 2 hours, while stirring it which is produced by the same method of (2.1), (2.2), and (2.3). Accordingly, the soluble oxygen is displaced with nitrogen. The porous membrane microcapsules are produced by the above same method after that.

(8.2) Bubbling the Surfactant Solution by the Inert Gas

The soluble oxygen is displaced with the nitrogen by bubbling the surfactant solution used for the emulsion production with the nitrogen gas for 2 hours. The porous membrane microcapsules are produced by the same methods as (2.1), (2.2), and (2.3).

(8.3) The Oxygen Absorbent Addition

Add 2 g 1,3-diphenylisobenzofuran as the oxygen absorbent to the solution to be contained in the microcapsules produced by the same methods of (2.1), (2.2), and (2.3). The porous membrane microcapsules are produced by the same method after that.

(8.4) Bubbling the Polymerizable Monomer and the Oxygen Absorbent Addition

The porous membrane microcapsules are produced by the combination of the bubbling process specified in (8.1) with the oxygen absorbent addition process specified in (8.3).

(8.5) Bubbling the Polymerizable Monomer and Surfactant Solution, and the Oxygen Absorbent Addition The porous membrane microcapsules are produced by the combination of the bubbling process of the polymerizable monomer specified in (8.1) and the surfactant solution specified in (8.2), and the oxygen absorbent addition process specified in (8.3).

(8.6) The Comparison of the Photosensitivity in the Various Methods

Table 2 demonstrates the period for hardening which relates to photosensitivity in each method of (8.1), (8.2), (8.3), (8.4), and (8.5) and in the method without the oxygen displacing step in the prior art in the production of microcapsules.

The periods for hardening are figured out from a starting period of irradiating the light energy of $3.3 \times 10^6$ erg/sec cm$^2$ through an ultraviolet rays cut filter to the porous membrane microcapsules obtained by each method, to a period of which hardening is done.

TABLE 2

| | Period for Hardening |
|---|---|
| The prior art | 2.55 (sec) |
| Bubbling of Polymerizable Monomer: (8.1) | 0.97 |
| Bubbling of Surfactant: (8.2) | 1.23 |
| Oxygen Absorbent Addition: (8.3) | 0.88 |
| Combination of (8.1) with (8.3): (8.4) | 0.76 |
| Combination of (8.1), (8.2), & (8.3): (8.5) | 0.65 |

Considerablly shorter periods are required in the hardening process of each method of bubbling the polymerizable monomer and the surfactant solution by the inert gas such as nitrogen specified in (8.1) and (8.2) and the oxygen absorbent addition specified in (8.3). Moreover, the above mentioned combinations of the methods depending on situations accelerate the hardening period noticeably in comparison with the method of prior art.

As described in detail, it enables to improve the photosensitivity of the microcapsules and shorten the hardening period in the production process of the photosensitive microcapsules by using the hydrophobic sensitizer and the ionic surfactant, and displacing the soluble water and the soluble oxygen from the content of the microcapsules. Further, the photoimaging and thermal development recording media of fine quality can be obtained by using this microcapsule.

What is claimed is:

1. A method of producing a photosensitive microcapsule which contains a polymerizable monomer and a polymerization initiator to initiate the polymerization of said polymerizable monomer, said method comprising the steps of: displacing soluble water in said polymerizable monomer; producing a solution to be contained in the microcapsules by adding the polymerization initiator and a first material for the microcapsule membrane to said polymerizable monomer in which said soluble water is displaced; producing an emulsion by adding an ionic surfactant solution to said solution to be contained in the microcapsules and emulsifying said solution with an agitator; and producing a microcapsule membrane by adding a second material for the microcapsule membrane to said emulsion.

2. The method of producing a photosensitive microcapsule according to claim 1, wherein said step of displacing the soluble water in said polymerizable monomer is distillation of said polymerizable monomer.

3. The method of producing a photosensitive microcapsule according to claim 1, wherein said step of displacing the soluble water in said polymerizable monomer is to add a dehydrating agent to said polymerizable monomer.

4. The method of producing a photosensitive microcapsule according to claim 1, wherein said ionic surfactant is a coaggregate of an aromatic vinyl compound and a dicarboxylic acid anhydride.

5. The method of producing a photosensitive microcapsule according to claim 4, wherein said ionic surfactant is a styrene-maleic anhydride coaggregate.

6. The method of producing a photosensitive microcapsule according to claim 1, wherein a concentration range of said ionic surfactant solution is 1 to 10% (W/W).

7. The method of producing a photosensitive microcapsule according to claim 1, further comprising the step of displacing the soluble oxygen in said polymerizable monomer.

8. The method of producing a photosensitive microcapsule according to claim 7, wherein said step of displacing the soluble oxygen in said polymerizable monomer is to bubble said polymerizable monomer with an inert gas.

9. The method of producing a photosensitive microcapsule according to claim 7, wherein said step of displacing the soluble oxygen in said polymerizable monomer is to add an oxygen absorbent to said polymerizable monomer.

10. The method of producing a photosensitive microcapsule according to claim 1, further comprising the step of displacing the soluble oxygen in said surfactant solution.

11. The method of producing a photosensitive microcapsule according to claim 10, wherein said step of displacing the soluble oxygen in said surfactant solution is to bubble said surfactant solution.

12. The method of producing a photosensitive microcapsule according to claim 10, wherein said step of displacing the soluble oxygen in said surfactant solution is to add the oxygen absorbent to said surfactant solution.

13. A method of producing a photosensitive microcapsule which contains a polymerizable monomer and a polymerization initiator, comprising the steps of: providing a polymerizable monomer containing soluble water; displacing soluble water in the polymerizable monomer by performing one or both of (1) distilling the polymerizable monomer and (2) adding a dehydrating agent to the polymerizable monomer; after the displacing step, adding a polymerization initiator and a first microcapsule-forming material to the polymerizable monomer to produce a solution; adding an ionic surfactant to the solution; emulsifying the solution and the ionic surfactant to form an emulsion; and producing a microcapsule membrane by adding a second microcapsule-forming material to the emulsion.

14. A method of producing a photosensitive microcapsule according to claim 13 wherein the ionic surfactant comprises a coaggregate of an aromatic vinyl compound and a dicarboxylic acid anhydride, and has a concentration range between 1 to 10% (W/W).

15. A method of producing a photosensitive microcapsule according to claim 14; wherein the coaggregate of an aromatic vinyl compound and a dicarboxylic acid anhydride is a styrene-maleic anhydride coaggregate, and has a concentration range between 1 to 10% (W/W).

16. A method of producing a photosensitive microcapsule according to claim 13, further comprising the step of displacing soluble oxygen in the polymerizable monomer by performing one or both of (1) bubbling the polymerizable monomer with an inert gas and (2) adding an oxygen absorbent to the polymerizable monomer.

17. A method of producing a photosensitive microcapsule according to claim 13; further comprising the step of displacing soluble oxygen in the ionic surfactant by performing one or both of (1) bubbling the ionic surfactant with an inert gas and (2) adding an oxygen absorbent to the surfactant.

18. A method of producing a photosensitive microcapsule which contains a polymerizable monomer and a polymerization initiator, comprising the steps of: providing a polymerizable monomer containing soluble water; displacing soluble water in the polymerizable monomer by performing one or both of (1) distilling the polymerizable monomer and (2) adding a dehydrating agent to the polymerizable monomer; after the displacing step, adding a polymerization initiator and a first microcapsule-forming material to the polymerizable monomer to produce a solution; displacing soluble oxygen in at least one of the polymerizable monomer and an ionic surfactant by performing at least one of (1) bubbling the polymerizable monomer with an inert gas, (2) bubbling the ionic surfactant with an inert gas, (3) adding an oxygen absorbent to the polymerizable monomer and (4) adding an oxygen absorbent to the surfactant; adding the ionic surfactant to the solution; emulsifying the solution and the ionic surfactant to form an emulsion; and producing a microcapsule membrane by adding a second microcapsule-forming material to the emulsion.

19. A method of producing a photosensitive microcapsule according to claim 18 wherein the step of displacing soluble water comprises performing one or both of (1) distilling the polymerizable monomer by vacuum distillation and (2) adding a dehydrating agent comprised of sodium sulfate.

20. A method of producing a photosensitive microcapsule according to claim 18 wherein the step of displacing soluble oxygen comprises performing at least one of bubbling the polymerizable monomer with nitrogen gas and adding an oxygen absorbent comprising 1,3-diphenylisobenzofuran.

21. A method of producing a photosensitive microcapsule according to claim 18 wherein the ionic surfactant comprises a coaggregate of an aromatic vinyl compound and a dicarboxylic acid anhydride, and wherein the ionic surfactant has a concentration range between 1 to 10% (W/W).

22. A method of producing a photosensitive microcapsule according to claim 21 wherein the coaggregate of an aromatic vinyl compound and a dicarboxylic acid anhydride is a styrene-maleic anhydride coaggregate, and has a concentration range between 1 to 10% (W/W).

* * * * *